United States Patent
Kim et al.

(10) Patent No.: US 9,949,379 B2
(45) Date of Patent: Apr. 17, 2018

(54) FLEXIBLE PRINTED CIRCUIT BOARD AND METHOD FOR MANUFACTURING SAME

(71) Applicant: AMOGREENTECH CO., LTD., Gimpo-si, Gyeonggi-do (KR)

(72) Inventors: Jongsoo Kim, Gyeonggi-do (KR); Jeong-Sang Yu, Gyeonggi-do (KR); O-Chung Kwon, Chungcheongbuk-do (KR); Jae-Sic Kim, Chungcheongnam-do (KR)

(73) Assignee: Amogreentech Co., Ltd., Gimpo-si (KR)

( * ) Notice: Subject to any disclaimer, the term of this patent is extended or adjusted under 35 U.S.C. 154(b) by 14 days.

(21) Appl. No.: 14/897,214

(22) PCT Filed: Apr. 30, 2014

(86) PCT No.: PCT/KR2014/003831
§ 371 (c)(1),
(2) Date: Dec. 9, 2015

(87) PCT Pub. No.: WO2014/178639
PCT Pub. Date: Nov. 6, 2014

(65) Prior Publication Data
US 2016/0135285 A1    May 12, 2016

(30) Foreign Application Priority Data

Apr. 30, 2013 (KR) .................. 10-2013-0048596
Aug. 29, 2013 (KR) .................. 10-2013-0103102

(51) Int. Cl.
*H05K 3/36* (2006.01)
*H05K 3/28* (2006.01)
(Continued)

(52) U.S. Cl.
CPC ............ *H05K 3/361* (2013.01); *H05K 1/028* (2013.01); *H05K 1/0298* (2013.01); *H05K 1/092* (2013.01);
(Continued)

(58) Field of Classification Search
CPC .. H05K 1/0281; H05K 1/0283; H05K 1/0393; H05K 3/361; H05K 3/363; H05K 3/365
See application file for complete search history.

(56) References Cited

U.S. PATENT DOCUMENTS

2003/0138733 A1    7/2003    Sachdev et al.
2005/0196707 A1    9/2005    Cok
(Continued)

FOREIGN PATENT DOCUMENTS

CN    1213156 A    4/1999
JP    09092980    4/1997
(Continued)

OTHER PUBLICATIONS

International Preliminary Report on Patentability for International Application No. PCT/KR2014/003831 dated Nov. 3, 2015, 7 pages.
(Continued)

*Primary Examiner* — Jeremy C Norris
(74) *Attorney, Agent, or Firm* — TraskBritt

(57) ABSTRACT

A flexible printed circuit board includes a substrate, a circuit pattern formed on the substrate, and a protective coating layer formed on the substrate by applying and curing a coating solution to cover and protect the circuit pattern. A method for manufacturing forming a circuit pattern on a substrate and forming a protective coating layer for covering and protecting the circuit pattern by applying a coating solution on the substrate. The circuit pattern may be securely attached to the substrate, and damage and deformation of the circuit pattern due to repeated bending or warping of the (Continued)

substrate may be prevented, ultimately improving operational reliability.

9 Claims, 12 Drawing Sheets

(51) Int. Cl.
*H05K 3/46* (2006.01)
*H05K 1/02* (2006.01)
*H05K 1/09* (2006.01)
*H05K 1/11* (2006.01)
*H05K 3/00* (2006.01)
*H05K 3/10* (2006.01)
*H05K 1/03* (2006.01)

(52) U.S. Cl.
CPC .......... *H05K 1/115* (2013.01); *H05K 3/0011* (2013.01); *H05K 3/10* (2013.01); *H05K 3/285* (2013.01); *H05K 3/46* (2013.01); *H05K 3/4664* (2013.01); *H05K 3/4676* (2013.01); *H05K 1/0393* (2013.01); *H05K 2201/0145* (2013.01); *H05K 2201/0154* (2013.01); *H05K 2201/0209* (2013.01); *H05K 2201/0317* (2013.01); *H05K 2203/0759* (2013.01)

(56) References Cited

U.S. PATENT DOCUMENTS

| | | |
|---|---|---|
| 2006/0193970 A1 | 8/2006 | Myung et al. |
| 2010/0113689 A1* | 5/2010 | Naiki .................. C08G 18/3234 524/606 |
| 2010/0116525 A1* | 5/2010 | Oka ....................... H05K 1/118 174/254 |
| 2015/0225523 A1* | 8/2015 | Suenaga ............ C08G 73/1039 428/435 |

FOREIGN PATENT DOCUMENTS

| | | |
|---|---|---|
| JP | 2005150710 | 6/2005 |
| JP | 2007129153 A | 5/2007 |
| KR | 1020010074011 A | 8/2001 |
| KR | 1020050017905 A | 2/2005 |
| KR | 1020080031713 A | 4/2008 |
| KR | 102009004767 A | 1/2009 |
| KR | 1020120116297 A | 10/2012 |
| KR | 101225363 B1 | 1/2013 |
| KR | 1020077025470 | 1/2013 |

OTHER PUBLICATIONS

International Search Report for International Application No. PCT/KR2014/003831 dated Aug. 7, 2014, 2 pages.
International Written Opinion for International Application No. PCT/KR2014/003831 dated Aug. 7, 2014, 9 pages.
Chinese First Office Action for Chinese Application No. 201480032653.6, dated Jun. 28, 2017, 18 pages.
Chinese First Search for Chinese Application No. 201480032653.6, dated Jun. 19, 2017, 2 pages.
Korean Final Rejection for Korean Patent Application No. 10-2014-0052181, dated Nov. 27, 2015, 7 pages.
Korean Final Rejection for Korean Patent Application No. 10-2014-0052182, Nov. 27, 2015, 8 pages.
Korean Written Opinion for Korean Application No. 10-2014-0052182, dated Dec. 30, 2015, 16 Pages.
Korean Written Opinion for Korean Application No. 10-2014-0052181, dated Jun. 22, 2015, 17 pages.
Korean Written Opinion for Korean Application No. 10-2014-0052182, dated Jun. 22, 2015, 20 Pages.
Korean Written Opinion for Korean Application No. 10-2014-0052181, dated Dec. 30, 2015, 15 pages.
Korean Written Opinion for Korean Application No. 10-2014-0052181, dated Apr. 27, 2016, 20 pages.
Korean Written Opinion for Korean Application No. 10-2014-0052182, dated Apr. 27, 2016, 22 Pages.

* cited by examiner

FLEXIBLE PRINTED CIRCUIT BOARD AND METHOD FOR MANUFACTURING SAME

CROSS-REFERENCE TO RELATED APPLICATIONS

This application is a national phase entry under 35 U.S.C. § 371 of International Patent Application PCT/KR2014/003831, filed Apr. 30, 2014, designating the United States of America and published in English as International Patent Publication WO 2014/178639 A1 on Nov. 6, 2014, which claims the benefit under Article 8 of the Patent Cooperation Treaty and under 35 U.S.C. § 119(e) to Korean Patent Application Serial No. 10-2013-0103102, filed Aug. 29, 2013, and to Korean Patent Application Serial No. 10-2013-0048596, filed Apr. 30, 2013.

TECHNICAL FIELD

This disclosure relates to a flexible printed circuit board and a method for manufacturing the same and, more particularly, to a flexible printed circuit board, including a protective coating layer for protecting a circuit pattern, and a method for manufacturing the same.

BACKGROUND

Typically, flexible printed circuit boards, which are configured such that a circuit pattern is formed on a thin insulating film, find applications in many fields including those of mobile electronic instruments, as well as automatic instruments and displays that must be flexible for their operation.

Particularly, there has been a strong demand for flexible printed circuit boards for mobile terminals such as smartphones. For example, flexible printed circuit boards are mainly utilized in NFC (Near Field Communication) antennas or digitizers of mobile terminals.

When installed in a display panel of an electronic instrument, such as a cellular phone, PDA, laptop computer, etc., a digitizer functions to recognize and represent the coordinates of touch points on the display panel, allowing for the natural representation of written letters or notes on the display panel.

Accordingly, the size of digitizers corresponds to that of display panels. With the tendency of display panels toward enlargement, such as in smartphones, tablet PCs, outdoor advertising displays, etc., digitizers have gradually increased in size.

With reference to FIG. 1, the demand for an electronic blackboard 1 is increasing in companies or educational institutions such as schools or academies because screen output is possible and writing is possible on the screen thereof, and the digitizer is applied in the electronic blackboard 1 so as to enable smooth and accurate writing.

The electronic blackboard 1 is installed indoors or outdoors and is thus used for lectures, seminars, conferences, presentations, etc., and includes a large display panel so that a large number of people can clearly see the screen.

Typically, a flexible printed circuit board is manufactured by etching copper foil that has been laminated on a flexible substrate or by printing a circuit pattern with a conductive paste or conductive ink on a flexible insulating film and then plating the circuit pattern.

However, such flexible printed circuit boards have to undergo etching or plating, and thus suffer from complicated manufacturing processes and high manufacturing costs.

Also, a coverlay is utilized to protect the circuit pattern, but incurs high manufacturing costs and makes it difficult to form to a thickness equal to or less than a predetermined level.

Also, the adhesion between the circuit pattern and the insulating film may decrease in the course of plating the terminal portion of the circuit pattern, undesirably leading to the circuit pattern easily separating from the insulating film.

Also, when the flexible printed circuit board is applied to flexible displays, the circuit pattern may be damaged and deformed due to repeated bending and warping, undesirably deteriorating operational reliability.

Particularly in the case where the digitizer is used for the electronic blackboard having a large screen, the size of the substrate has to be large so as to correspond to the large screen, undesirably causing problems including high manufacturing costs in the formation of the circuit pattern, easy separation of the circuit pattern from the insulating film, and damage and deformation of the circuit pattern due to the bending and warpage.

Also, the flexible printed circuit board is manufactured to have a multilayer structure so as to effectively dispose the circuits for its operation. For this, insulating films having different circuit pattern layers are attached using a bonding sheet.

Such a multilayered flexible printed circuit board includes via holes for electrically connecting the individual circuit pattern layers, but is problematic in that the manufacturing processes are complicated and the individual insulating films are adhered using a bonding sheet to be integrally formed, thus increasing the manufacturing costs.

Also, the multilayered flexible printed circuit board is problematic in that stable operational reliability is not maintained when the bondability of the bonding sheet deteriorates, and the thickness thereof is difficult to decrease, which undesirably increases the thickness of products including the same.

BRIEF SUMMARY

Technical Problem

Accordingly, this disclosure has been made, keeping in mind the above problems encountered in the related art. An object of this disclosure is to provide a flexible printed circuit board and a method for manufacturing the same, in which a circuit pattern firmly attached to a substrate for the flexible printed circuit board may be maintained, and the flexible printed circuit board is freely flexible.

Another object of this disclosure is to provide a flexible printed circuit board and a method for manufacturing the same, in which low manufacturing cost and stable operational reliability of circuits may be ensured, as well as low thickness in the formation of a double-layer circuit pattern.

Technical Solution

In order to accomplish the above objects, this disclosure provides a flexible printed circuit board, comprising: a substrate; a circuit pattern formed on the substrate; and a protective coating layer formed on the substrate by applying and curing a coating solution to cover and protect the circuit pattern.

In this disclosure, the protective coating layer may be formed to a thickness of at least 9 μm on the circuit pattern.

The flexible printed circuit board, according to an embodiment of this disclosure, may further comprise an additional circuit pattern formed on the protective coating layer, wherein the protective coating layer may have a via hole for electrically connecting the circuit pattern and the additional circuit pattern to each other, and the via hole may be filled with a conductor that electrically connects the circuit pattern and the additional circuit pattern to each other.

In this disclosure, the circuit pattern may comprise a first circuit pattern formed on a first surface of the substrate and a second circuit pattern formed on a second surface of the substrate, the protective coating layer may comprise a first protective coating layer for covering and protecting the first circuit pattern and a second protective coating layer for covering and protecting the second circuit pattern, and the substrate may include a via hole for electrically connecting the first circuit pattern and the second circuit pattern to each other, and the via hole may be filled with a conductor.

In the flexible printed circuit board according to an embodiment of this disclosure, at least one additional circuit pattern layer may be formed on each of the first protective coating layer and the second protective coating layer, at least one additional protective coating layer may be formed on each of the first protective coating layer and the second protective coating layer, and the same numbers of protective coating layers and circuit pattern layers may be formed on each of the first surface and the second surface of the substrate.

In this disclosure, of an X-axis coordinate recognition pattern part including a plurality of X-axis electrodes spaced apart from each other in a transverse direction and a Y-axis coordinate recognition pattern part including a plurality of Y-axis electrodes spaced apart from each other in a longitudinal direction, any one may be the first circuit pattern, and the other may be the second circuit pattern.

In addition, this disclosure provides a method for manufacturing a flexible printed circuit board, comprising: forming a circuit pattern on a substrate; and forming a protective coating layer for covering and protecting the circuit pattern by applying a coating solution on the substrate.

In this disclosure, forming the circuit pattern may comprise printing a conductive paste and firing the circuit pattern.

The conductive paste may be a silver paste comprising a silver powder, a polymer resin, and a solvent, and the silver paste may comprise 73 to 88 wt % of a silver powder, 5.9 to 9.5 wt % of a polymer resin, and 5.7 to 18.0 wt % of a solvent, and the firing may be performed at 200 to 450° C.

Forming the protective coating layer may comprise applying the coating solution, excluding a portion in which a via hole is formed.

In this disclosure, the substrate may be a PI film or a PET film, and the coating solution may be a PAI solution or a PI solution.

In this disclosure, the coating solution may further comprise an anti-curling agent.

In this disclosure, the coating solution may be a PI solution including 2 to 5 wt % of silica or a PAI solution including 2 to 5 wt % of silica.

In this disclosure, forming the protective coating layer may comprise applying the coating solution on the substrate through screen printing using a waterproof mesh screen.

The method according to an embodiment of this disclosure may further comprise polishing the fired circuit pattern before forming the protective coating layer.

The method according to an embodiment of this disclosure may further comprise forming a via hole in the substrate and filling the via hole with a conductor before forming the circuit pattern. Forming the circuit pattern may comprise forming a first circuit pattern on a first surface of the substrate and forming a second circuit pattern on a second surface of the substrate, and forming the protective coating layer may comprise applying, drying and curing a coating solution on the first surface of the substrate and the second surface of the substrate, thus forming a first protective coating layer for covering and protecting the first circuit pattern and a second protective coating layer for covering and protecting the second circuit pattern on the first surface of the substrate and the second surface of the substrate, respectively.

The method according to an embodiment of this disclosure may further comprise baking the substrate through heating to remove water therefrom before forming the circuit pattern.

Advantageous Effects

According to this disclosure, a circuit pattern formed on a substrate is protected by a coating layer, thus maintaining the circuit pattern firmly attached to the substrate. Furthermore, damage and deformation of the circuit pattern due to repeated bending or warping of the substrate can be prevented, thus improving operational reliability.

According to this disclosure, there is no need for an additional coverlay, and high chemical resistance can be attained because the circuit pattern is protected by the coating layer.

According to this disclosure, a multilayered flexible printed circuit board can be made thin, whereby products using the same can be compactly manufactured and merchantability thereof can increase.

According to this disclosure, as the substrate is preliminarily thermally treated, dimensional stability can be ensured when the circuit pattern printed with conductive paste is fired and, furthermore, adhesion between the circuit pattern and the substrate can be prevented from deteriorating, which can occur due to the deformation of the film upon firing. Moreover, stable adhesion of the circuit pattern can be maintained even after firing.

According to this disclosure, a via hole can be filled with sufficient conductive paste, thereby improving the operational reliability of the circuit pattern formed on both surfaces of the substrate.

According to this disclosure, the manufacturing cost can be lowered, resulting in considerably increased merchantability.

DETAILED DESCRIPTION

Figure 1:
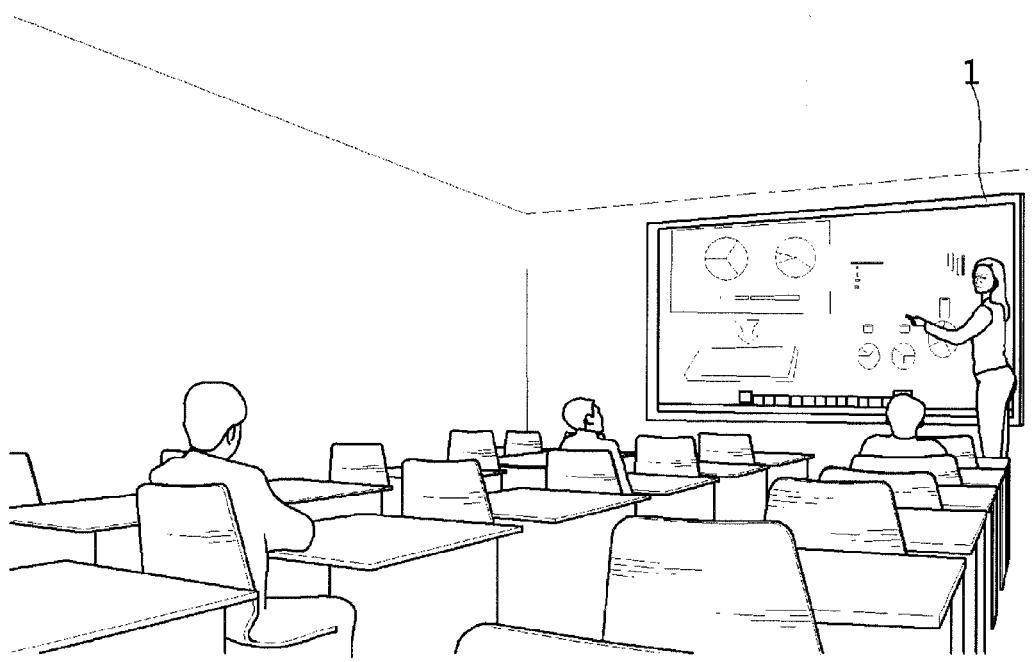
FIG. 1 illustrates the use of an electronic blackboard.

This disclosure will be described in detail below with reference to the accompanying drawings. In the following description, redundant descriptions and detailed descriptions of known functions and elements that may unnecessarily make the gist of this disclosure obscure will be omitted. Embodiments of this disclosure are provided to fully describe this disclosure to those having ordinary knowledge in the art to which this disclosure pertains. Accordingly, in the drawings, the shapes and sizes of elements may be exaggerated for the sake of clearer description.

Figure 2:
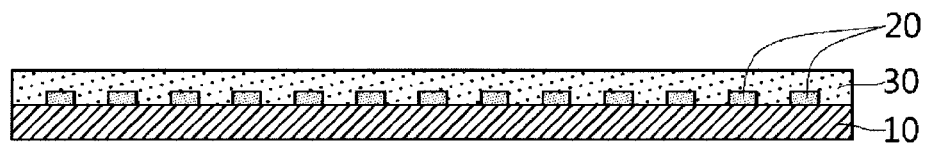
FIG. 2 is a cross-sectional view illustrating a flexible printed circuit board according to an embodiment of this disclosure.

FIG. 2 is a cross-sectional view illustrating a flexible printed circuit board according to an embodiment of this disclosure. With reference to FIG. 2, the flexible printed circuit board according to an embodiment of this disclosure comprises a substrate 10 and a circuit pattern 20 formed on the substrate 10. Also, a protective coating layer 30 for covering and protecting the circuit pattern 20 is formed on the substrate 10. The protective coating layer 30 is formed by applying and curing a coating solution.

The substrate 10 may be exemplified by a PI film, a PET film, or a polyester film. Particularly useful is a PI film. A PI film is thin and flexible, and has high bending resistance and high heat resistance to withstand a firing process at a temperature ranging from 200 to 450° C., with low dimensional variation.

The circuit pattern 20 may be formed of metal foil, such as copper foil, silver foil or aluminum foil, or may be formed by firing a conductive paste.

Preferably, the circuit pattern 20 is formed through firing using conductive paste in order to reduce the manufacturing cost and simplify the manufacturing process.

Figure 3:
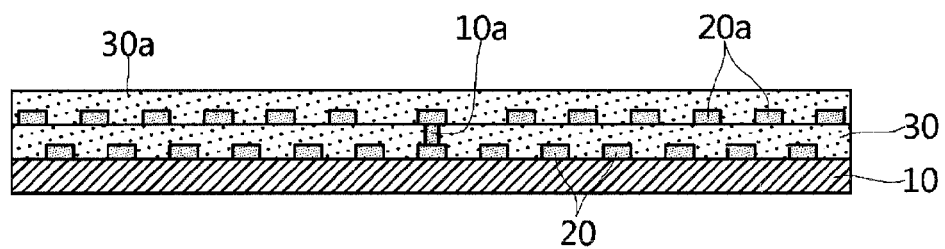
FIG. 3 is a cross-sectional view illustrating a flexible printed circuit board according to another embodiment of this disclosure.

With reference to FIG. 3, the flexible printed circuit board according to an embodiment of this disclosure may further comprise an additional circuit pattern 20a formed on the protective coating layer 30.

The additional circuit pattern 20a may be formed of metal foil, such as copper foil, silver foil or aluminum foil, or may be formed by firing a conductive paste.

The additional circuit pattern 20a is preferably formed through firing using conductive paste in order to reduce the manufacturing cost and simplify the manufacturing process.

Formed in the protective coating layer 30 is a via hole 10a for electrically connecting the circuit pattern 20 and the additional circuit pattern 20a to each other, and the via hole 10a is filled with a conductor that electrically connects the circuit pattern 20 and the additional circuit pattern 20a.

Of an X-axis coordinate recognition pattern part including a plurality of X-axis electrodes spaced apart from each other in a transverse direction and a Y-axis coordinate recognition pattern part including a plurality of Y-axis electrodes spaced apart from each other in a longitudinal direction, any one is the circuit pattern 20 formed on the substrate 10, and the other is the additional circuit pattern 20a formed on the protective coating layer 30.

The flexible printed circuit board according to an embodiment of this disclosure is exemplified by a digitizer configured such that of the X-axis coordinate recognition pattern part and the Y-axis coordinate recognition pattern part, any one is formed on the substrate 10 and the other is formed on the surface of the protective coating layer 30 to determine the coordinates of touch points. The X-axis coordinate recognition pattern part and the Y-axis coordinate recognition pattern part are electrically conducted to each other through the via hole 10a.

The circuit pattern 20 may be provided in a grid form, composed of a plurality of sets of X-Y coordinates on the surfaces of the substrate 10 and the protective coating layer 30.

Formed on the protective coating layer 30 is an additional protective coating layer 30a for covering and protecting the additional circuit pattern 20a, and a further circuit pattern (not shown) may be formed on the additional protective coating layer 30a.

The flexible printed circuit board according to an embodiment of this disclosure may be provided in the form of a multilayered flexible printed circuit board comprising a plurality of protective coating layers and a plurality of circuit pattern layers formed respectively on the protective coating layers.

The protective coating layer 30 is formed by applying and curing a coating solution on the surface of the substrate 10 on which the circuit pattern 20 is formed so as to cover the circuit pattern 20, thus protecting the circuit pattern 20.

The protective coating layer 30 is provided as a synthetic resin coating layer using the same type of coating solution as in the substrate 10, whereby it may be strongly adhered to the substrate 10 and may be more securely integrated with the substrate 10. For example, the substrate 10 is a PI film, and the protective coating layer 30 is a PI coating layer or a PAI coating layer.

The protective coating layer 30 is preferably formed of a coating solution including an anti-curling agent, and the anti-curling agent may be silica.

In the case where the protective coating layer 30 is formed only on one surface of the substrate 10, the substrate 10 may be curled from the end thereof due to the shrinkage of the protective coating layer 30 when the applied coating solution is cured.

The anti-curling agent may prevent the curling of the end of the substrate 10 due to the shrinkage of the protective coating layer 30, so that the substrate 10 having the protective coating layer 30 becomes maximally flat.

The protective coating layer 30 is preferably formed to a thickness of at least 9 μm, and more preferably 10 μm or more, on the circuit pattern 20. This thickness corresponds to the minimum thickness that allows the protective coating layer to function as an insulating layer for insulating the circuit pattern 20. For example, when the thickness of the circuit pattern 20 is 10 μm, the protective coating layer 30 is formed to have a thickness of at least 19 μm on the substrate 10. When the thickness of the circuit pattern 20 is 15 μm, the protective coating layer 30 is preferably formed to a thickness of at least 24 μm on the substrate.

Figure 4:
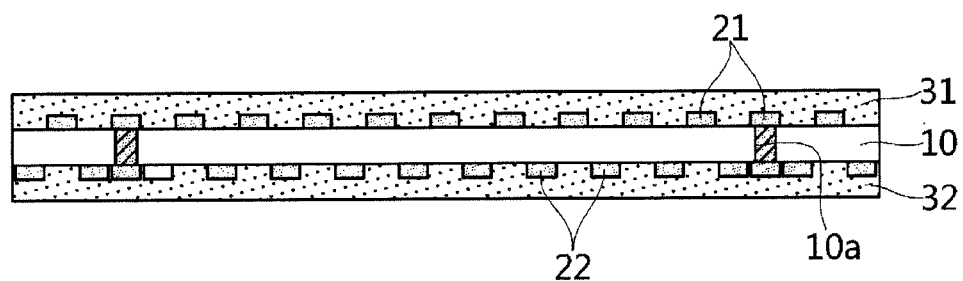
FIGS. 4 and 5 are cross-sectional views illustrating flexible printed circuit boards according to additional embodiments of this disclosure.

With reference to FIG. 4, the circuit pattern 20 includes a first circuit pattern 21 formed on the first surface of the substrate 10 and a second circuit pattern 22 formed on the second surface of the substrate 10, and the protective coating layer includes a first protective coating layer 31 for covering and protecting the first circuit pattern 21 and a second protective coating layer 32 for covering and protecting the second circuit pattern 22.

Formed in the substrate 10 is the via hole 10a for electrically connecting the first circuit pattern 21 and the second circuit pattern 22 to each other.

The via hole 10a is filled with a conductor so that the first circuit pattern 21 and the second circuit pattern 22 are electrically connected, and the conductor may be formed through the loading of conductive paste, or may be formed through plating.

Of an X-axis coordinate recognition pattern part including a plurality of X-axis electrodes spaced apart from each other in a transverse direction and a Y-axis coordinate recognition pattern part including a plurality of Y-axis electrodes spaced apart from each other in a longitudinal direction, any one is the first circuit pattern 21 and the other is the second circuit pattern 22.

The flexible printed circuit board according to an embodiment of this disclosure is exemplified by a digitizer configured such that of the X-axis coordinate recognition pattern part and the Y-axis coordinate recognition pattern part, any one is formed on the first surface of the substrate 10 and the other is formed on the second surface of the substrate 10 to determine the coordinates of touch points. The X-axis coordinate recognition pattern part and the Y-axis coordinate recognition pattern part are electrically conducted to each other through the via hole 10a.

The first circuit pattern 21 and the second circuit pattern 22 may be provided in a grid form, composed of a plurality of sets of X-Y coordinates on the first and second surfaces of the substrate 10.

The first protective coating layer 31 and the second protective coating layer 32 are formed on both surfaces of the substrate 10, thus preventing the curling of the substrate 10 and maintaining the substrate 10 to be flat.

Figure 5:
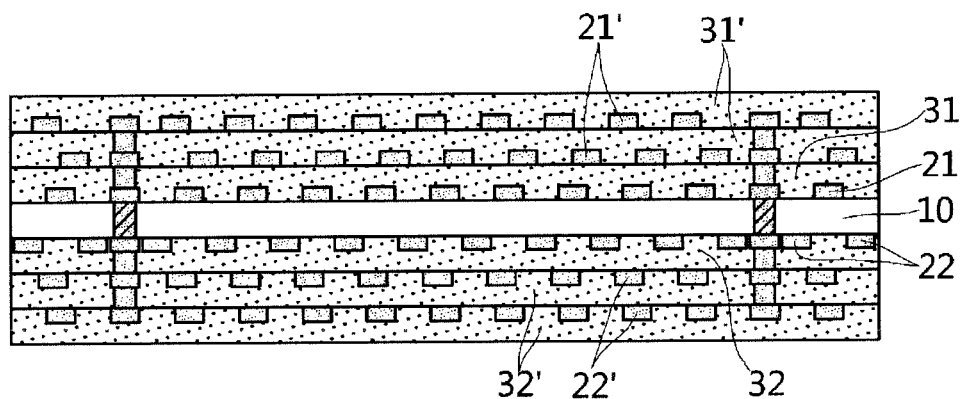

With reference to FIG. 5, the flexible printed circuit board according to an embodiment of this disclosure is configured such that additional circuit pattern layers 21' are formed on the first protective coating layer 31 and additional protective coating layers 31' are formed on the first protective coating layer 31, whereby a plurality of protective coating layers and a plurality of circuit pattern layers formed respectively on the protective coating layers are provided on the first surface of the substrate 10. Furthermore, additional circuit pattern layers 22' are formed on the second protective coating layer 32 and additional protective coating layers 32' are formed on the second protective coating layer 32, whereby a plurality of protective coating layers and a plurality of circuit pattern layers formed respectively on the protective coating layers are provided on the second surface of the substrate 10.

The same numbers of protective coating layers and circuit pattern layers are formed on each of the first surface and the second surface of the substrate 10, thus preventing the curling of the substrate 10.

For example, when two circuit pattern layers and two protective coating layers are further formed on the first protective coating layer 31, two circuit pattern layers and two protective coating layers may also be provided on the second protective coating layer 32. In this way, the same numbers of protective coating layers and circuit pattern layers are respectively formed on both surfaces of the substrate 10, and ultimately the curling of the substrate 10 may be prevented.

The first protective coating layer 31 and the second protective coating layer 32 may be formed by applying the coating solution, excluding a portion in which the via hole 10a is formed. The circuit pattern layer formed on the first protective coating layer 31 and the circuit pattern layer formed on the second protective coating layer 32 may be electrically connected to each other through the via hole 10a.

Figure 6:
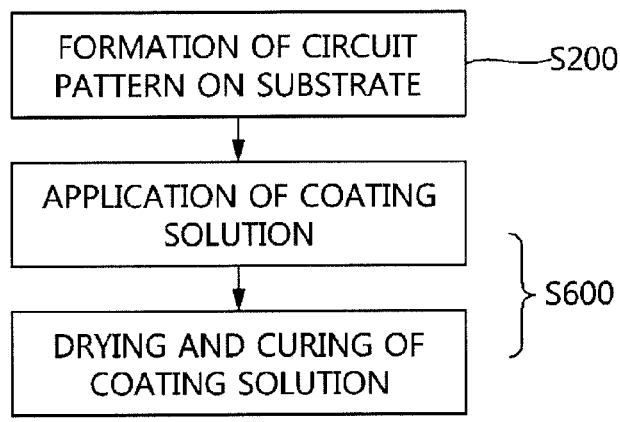
FIG. 6 is a flowchart illustrating the process of manufacturing a flexible printed circuit board according to an embodiment of this disclosure.
Figure 7:
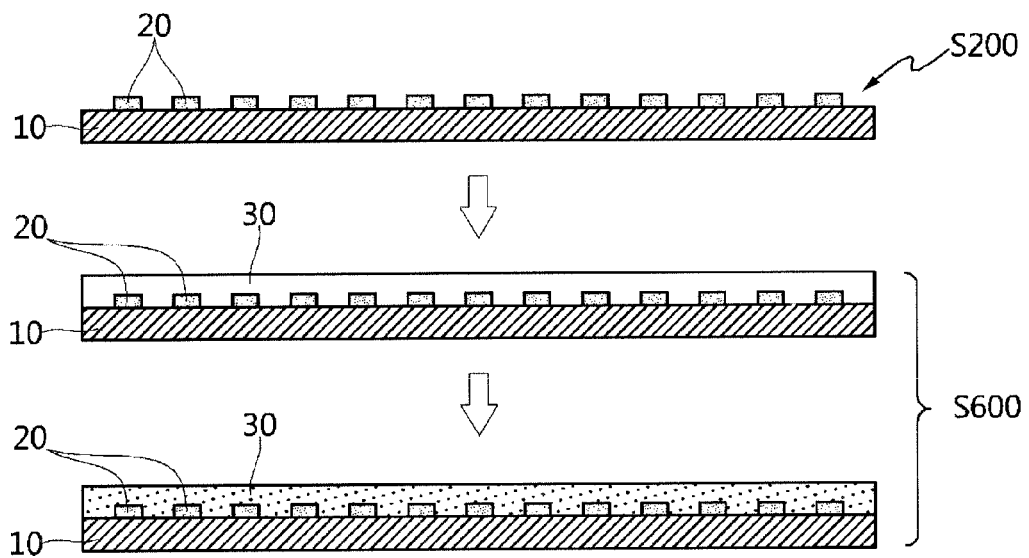
FIG. 7 schematically illustrates the process of manufacturing a flexible printed circuit board according to an embodiment of this disclosure.

With reference to FIGS. 6 and 7, the method for manufacturing a flexible printed circuit board according to an embodiment of this disclosure comprises forming a circuit pattern 20 on a substrate 10 (S200) and forming a protective coating layer 30 for covering and protecting the circuit pattern 20 by applying a coating solution on the substrate 10 (S600).

The step of forming the circuit pattern 20 (S200) may include attaching metal foil such as copper foil, silver foil or aluminum foil to the substrate 10 and then etching the metal foil, or may include punching metal foil such as copper foil, silver foil or aluminum foil and then transferring the metal foil.

The step of forming the circuit pattern 20 (S200) may include printing the circuit pattern 20 with a conductive paste on the substrate 10 and then firing the circuit pattern 20.

The step of forming the protective coating layer 30 (S600) includes applying, drying and curing the coating solution on the substrate 10 to form the protective coating layer 30 for covering and protecting the circuit pattern 20 on the substrate 10.

In the step of forming the protective coating layer 30 (S600), the applied coating solution may be cured by being heated at 200 to 450° C. for 20 to 50 minutes.

Figure 8:
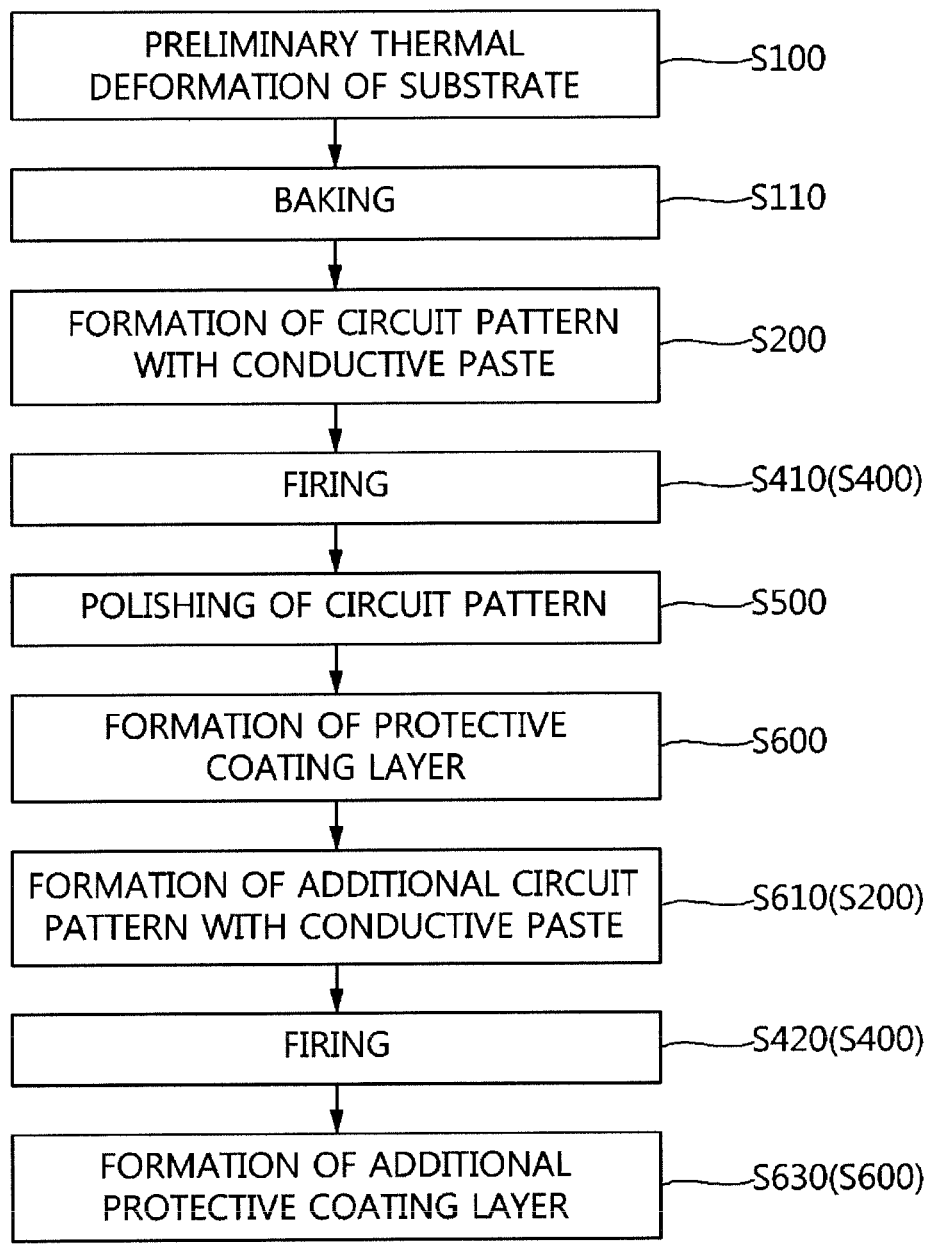
FIG. 8 is a flowchart illustrating the process of manufacturing a flexible printed circuit board according to another embodiment of this disclosure.
Figure 9:
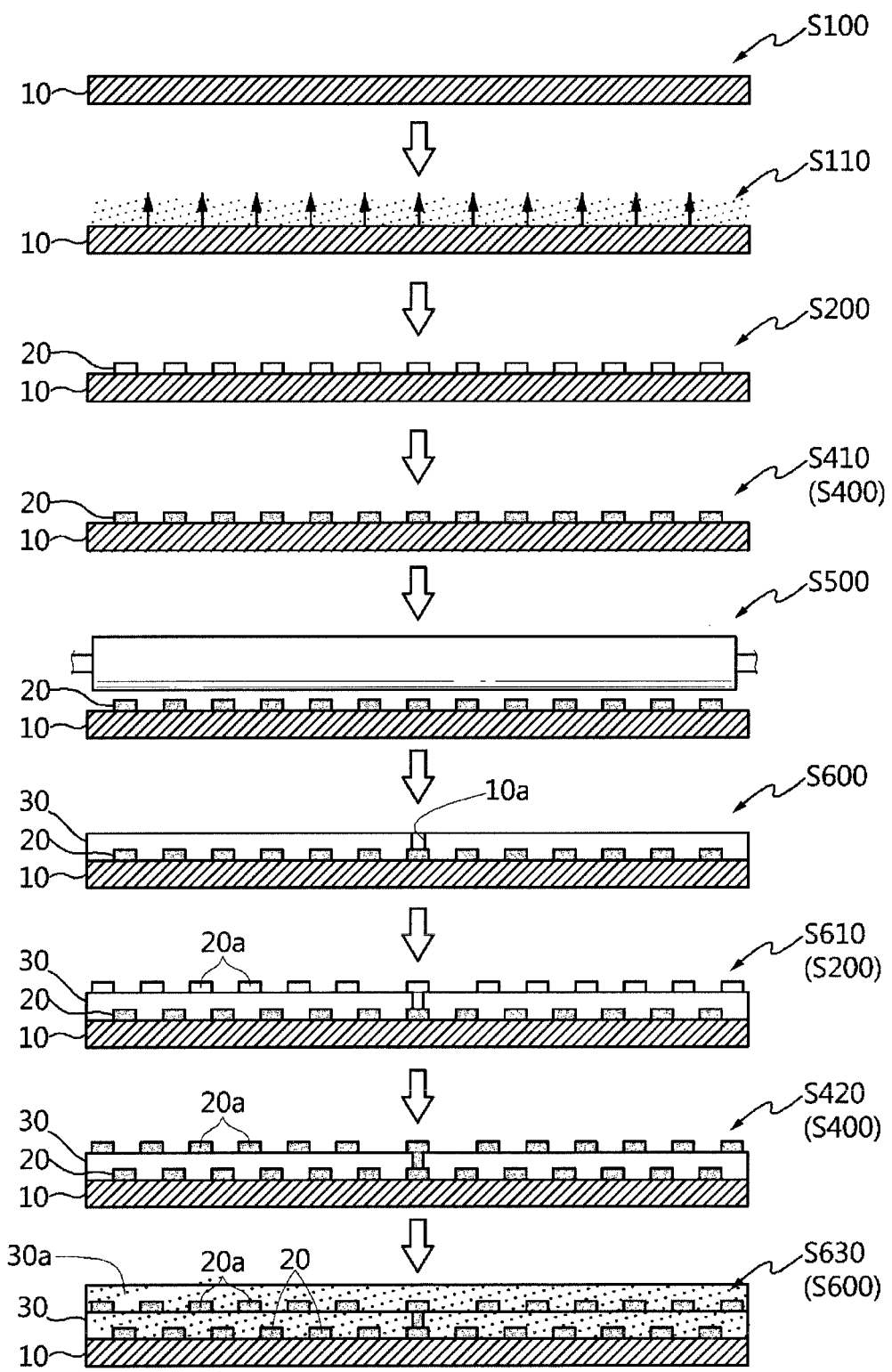
FIG. 9 schematically illustrates the process of manufacturing a flexible printed circuit board according to another embodiment of this disclosure.

With reference to FIGS. 8 and 9, the step of forming the circuit pattern 20 (S200) preferably includes printing the circuit pattern 20 with a conductive paste on the substrate 10.

Also, the method for manufacturing the flexible printed circuit board according to an embodiment of this disclosure preferably further comprises firing the circuit pattern 20 (S400).

The step of forming the circuit pattern 20 (S200) may further include forming an additional circuit pattern 20a on the protective coating layer 30 (S610).

Forming the additional circuit pattern 20a (S610) may include attaching metal foil such as copper foil, silver foil or aluminum foil onto the protective coating layer 30 and then etching the metal foil, or may include punching metal foil such as copper foil, silver foil or aluminum foil and then transferring the metal foil to the protective coating layer 30.

Preferably, forming the additional circuit pattern 20a (S610) includes printing the additional circuit pattern 20a with the conductive paste on the protective coating layer 30.

The firing step (S400) preferably includes firing the circuit pattern 20 (S410) and firing the additional circuit pattern 20a (S420).

When the additional circuit pattern 20a is formed through screen printing with the conductive paste and firing, the manufacturing cost may be reduced, and the manufacturing process may be simplified and, furthermore, the dried protective coating layer 30 may be cured without an additional curing process.

The step of forming the protective coating layer 30 (S600) includes applying the coating solution on the substrate 10 to form a protective coating layer 30, which is then dried, and forming the additional circuit pattern 20a (S610) includes printing the additional circuit pattern 20a with the conductive paste on the dried protective coating layer 30 and firing the additional circuit pattern 20a, whereby the protective coating layer 30 may be cured without an additional curing process.

The step of forming the protective coating layer 30 (S600) may further include forming an additional protective coating layer 30a for covering and protecting the additional circuit pattern 20a on the protective coating layer 30 (S630). As forming the additional circuit pattern 20a (S610) and forming the additional protective coating layer 30a are repeated, it is easy to manufacture a multilayered flexible printed circuit board having a plurality of protective coating layers 30 and a plurality of circuit pattern layers respectively formed on the protective coating layers 30.

Before the additional circuit pattern 20a is formed, the via hole 10a for electrically connecting the circuit pattern 20 and the additional circuit pattern 20a to each other may be formed in the protective coating layer 30.

The step of forming the via hole (10a) includes forming a via hole (10a) through the protective coating layer 30 and filling the via hole 10a through plating or with a conductive paste.

The step of forming the protective coating layer 30 (S600) preferably includes applying the coating solution to form a protective coating layer 30, excluding a portion in which the via hole 10a is formed. Thereby, the via hole 10a may be formed without the additional need for the step of forming the via hole 10a, so that the circuit pattern 20 and the additional circuit pattern 20a are electrically connected to each other.

Because the via hole 10a is filled with conductive paste when the additional circuit pattern 20a is formed through printing with conductive paste, the via hole 10a formed in the protective coating layer 30 functions to electrically connect the circuit pattern 20 and the additional circuit pattern 20a to each other.

Before the additional circuit pattern 20a is formed (S610), the via hole 10a may be filled with conductive paste and then the additional circuit pattern 20a may be formed through printing with conductive paste.

In the step of forming the protective coating layer 30 (S600), the portion of the circuit pattern 20, connected by the via hole 10a, is masked and covered, after which the coating solution is applied on the substrate 10 and dried, and the masked portion is then removed, thereby exposing the portion for connecting the circuit pattern 20 and the additional circuit pattern 20a, that is, the via hole 10a.

Also, in the step of forming the protective layer, the coating solution is applied through screen printing on the substrate 10 using a mesh screen, the portion of which, corresponding to the portion in which the via hole 10a is formed, is masked, and thereby the via hole 10a may be formed.

The step of forming the circuit pattern 20 (S200) includes drying the printed conductive paste before the firing step (S400), and the conductive paste may be dried at a temperature of 80° C. or less.

Printing the circuit pattern 20 or printing the additional circuit pattern 20a is preferably performed through screen printing. Screen printing exhibits a high curing rate and superior adhesion and flexibility, and is thus suitable for forming a fine pattern, so that a predesigned circuit pattern may be formed at low cost.

The circuit pattern 20 and the additional circuit pattern 20a may result from screen printing with conductive paste and then firing, thereby remarkably reducing the cost of manufacturing of the digitizer for use in an electronic blackboard having a large screen.

The conductive paste comprises a conductive metal powder and a binder. The conductive metal powder may include any one or a mixture of two or more selected from among silver, copper, aluminum, and nickel.

The conductive paste is preferably a silver paste comprising a silver powder, a polymer resin, and a solvent. The silver paste comprises 73 to 88 wt % of a silver powder, 5.9 to 9.5 wt % of a polymer resin, and 5.7 to 18.0 wt % of a solvent.

The silver paste may further comprise 0.35 to 2.90 wt % of a dispersant.

The polymer resin may be exemplified by polyester, with a molecular weight of 25,000.

The silver powder has a particle size ranging from 50 nm to 5 µm, and preferably from 0.5 to 1.2 µm. When the silver powder has a small particle size, it may easily move upon printing, and silver powder particles may be attached to each other upon firing to thus decrease resistance. The use of silver powder having a particle size larger than 5 µm makes it difficult to realize a resistance of 30Ω or less, and preferably 23Ω or less.

The firing step (S400) is performed by firing the circuit pattern 20 formed of the silver paste on the substrate 10 or the protective coating layer 30 at 200 to 450° C., and preferably 290 to 420° C. A firing temperature of 290 to 420° C. enables the stable firing of the circuit pattern 20 without deforming or damaging the synthetic resin film, that is, the PI film, which is the substrate 10 for the flexible printed circuit board. Given the above temperature range, the circuit pattern 20, which is fired after being printed with the conductive paste, may have a resistivity in a predetermined range, and the adhesion of the circuit pattern 20 meets or exceeds a critical level.

The firing step is performed to increase electrical conductivity through the growth of silver powder particles, and to enhance adhesion between the substrate 10 and the conductive material loaded in the via hole 10a, as will be described later.

The conductive powder (silver powder), printed on the substrate 10 and dried, may undergo interfacial separation from the substrate 10 or cracking.

When the printed conductive paste is merely dried without firing, electrical conduction occurs by the contact between silver powder particles, and when firing is performed, electrical conduction occurs by the growth of silver powder particles. Hence, when firing is performed after drying, electrical conductivity is further increased by the growth of silver powder particles, thereby further decreasing the resistance and preventing interfacial separation and cracking.

If the firing temperature is lower than 200° C., there is no effect of preventing interfacial separation and cracking. In contrast, if the firing temperature is higher than 450° C., the substrate 10 may be carbonized. Preferably, firing is carried out in the temperature range of 300 to 450° C.

The circuit pattern 20 is formed to have a resistivity ranging from 4.0 to 6.5 μΩ·cm.

The method for manufacturing the flexible printed circuit board according to an embodiment of this disclosure may further comprise preliminarily thermally deforming the substrate 10 through heating (S100), before the step of forming the circuit pattern 20 (S200).

The preliminarily thermally deforming step (S100) is a preliminary thermal treatment process for preventing the substrate 10 from deforming when fired, thereby increasing the dimensional stability of the substrate 10.

The preliminarily thermally deforming step (S100) includes heating the substrate 10, namely the PI film, to a temperature higher than or equal to the firing temperature in the firing step (S400) so that the PI film is preliminarily thermally deformed, thereby preventing the PI film from becoming deformed in the firing step (S400).

In the firing step (S400), the firing temperature is determined depending on the kind of flexible printed circuit board to be manufactured, the composition of the corresponding conductive paste, and the resistivity required of the circuit pattern 20. In the preliminarily thermally deforming step (S100), the substrate 10 is heated to a temperature higher than or equal to the firing temperature, which is set in the firing step (S400), so that the substrate is preliminarily thermally deformed.

Tables 1 to 3 below show the shrinkage variation of PI films, resulting from preliminary thermal treatment of PI films having different thickness and sizes at 400° C. for 7 hours and then heating of the preliminarily thermally treated PI films to a firing temperature of 350° C.

Table 1 below illustrates PI films having a thickness of ½ mil.

TABLE 1

| Film thickness | Film size (mm) | Shrinkage variation of film after preliminary thermal treatment (400° C., 7 hours) | Shrinkage at firing temp. (350° C., 30 minutes) | Cumulative shrinkage variation |
| --- | --- | --- | --- | --- |
| ½ mil | 287 | −1.8 (0.63%) | 0 | −1.8 (0.63%) |
| | 309 | −1.5 (0.49%) | 0 | −1.5 (0.49%) |
| | 250 | −0.5 (0.2%) | 0 | −0.5 (0.2%) |
| | 229 | −1.0 (0.44%) | 0 | −1.0 (0.44%) |

Table 2 below illustrates PI films having a thickness of 1 mil.

TABLE 2

| Film thickness | Film size (mm) | Shrinkage variation of film after preliminary thermal treatment (400° C., 7 hours) | Shrinkage at firing temp. (350° C., 30 minutes) | Cumulative shrinkage variation |
| --- | --- | --- | --- | --- |
| 1 mil | 291 | −2.0 (0.69%) | 0 | −2.0 (0.69%) |
| | 310 | −2.5 (0.81%) | 0 | −2.5 (0.81%) |
| | 250 | −1.5 (0.60%) | 0 | −1.5 (0.60%) |
| | 233 | −1.3 (0.56%) | 0 | −1.3 (0.56%) |

Table 3 below illustrates PI films having a thickness of 2 mil.

TABLE 3

| Film thickness | Film size (mm) | Shrinkage variation of film after preliminary thermal treatment (400° C., 7 hours) | Shrinkage at firing temp. (350° C., 30 minutes) | Cumulative shrinkage variation |
| --- | --- | --- | --- | --- |
| 2 mil | 286 | −2.5 (0.87%) | 0 | −2.5 (0.87%) |
| | 306 | −3.7 (1.21%) | 0 | −3.7 (1.21%) |
| | 250 | −2.0 (0.80%) | 0 | −2.0 (0.80%) |
| | 227 | −2.0 (0.88%) | 0 | −2.0 (0.88%) |

As is apparent from Tables 1 to 3, when preliminary thermal treatment is performed at a temperature higher than the firing temperature, there are no changes in shrinkage of the PI films upon re-heating at the firing temperature after preliminary thermal treatment, regardless of the thickness and size of the film.

Specifically, in the step of preliminarily thermally deforming the substrate 10 through heating (S100), the PI film is preliminarily thermally deformed before firing, thereby preventing the PI film from shrinking when the circuit pattern 20 is fired, thus ensuring the dimensional stability of the substrate 10 so that the circuit pattern 20 is precisely formed at a predesigned position thereof. Furthermore, adhesion of the circuit pattern 20 to the substrate 10 is prevented from deterioration attributable to the deformation of the substrate 10 caused by firing.

In the step of preliminarily thermally deforming the substrate 10 through heating (S100), the PI film, stored in the form of a roll, is heated in a heating furnace having a box shape, whereby a large PI film may be preliminarily thermally treated at one time, after which the preliminarily thermally treated PI film in roll form may be sequentially subjected to the steps of forming the circuit pattern 20 (S200) and firing the circuit pattern 20 (S400), using a roll-to-roll process.

The method for manufacturing the flexible printed circuit board according to an embodiment of this disclosure preferably further comprises baking the preliminarily thermally deformed substrate 10 through heating to remove water from the substrate 10 (S110), before the step of forming the circuit pattern 20 (S200).

Because the preliminarily thermally deformed substrate 10 may absorb water when stored for a long time, the baking step (S110) is performed by heating the substrate 10 at a temperature of 80 to 150° C., whereby water is removed from the substrate 10.

Before the step of forming the circuit pattern 20 (S200), the baking step (S110) is performed in a manner in which the substrate 10 that is being stored is heated to remove water therefrom, thus preventing the substrate 10 from shrinking due to the presence of water therein in the firing step (S400). In particular, since the PI film that is being stored may absorb water, the baking step (S110) may be performed before the step of forming the circuit pattern 20 (S200).

In the step of forming the protective coating layer 30, the coating solution is applied on the substrate 10 to form a protective coating layer 30, which is then dried.

The protective coating layer 30 may be cured by heating the applied coating solution at 200 to 450° C. for 20 to 50 minutes or, alternatively, may be cured in the course of firing the additional circuit pattern 20a (S420).

The coating solution is a PI solution comprising 15 to 35 wt % of PI, resulting from dissolving PI in a solvent, in which the solvent is an NMP diluted solution.

The coating solution may be a PAI solution, and the PAI solution may be applied so that the protective coating layer 30 is formed. The PAI solution contains 15 to 35 wt % of PAI, resulting from dissolving PAI in a solvent, in which the solvent is an NMP diluted solution.

The coating solution preferably further comprises an anti-curling agent, and the anti-curling agent may be silica. The coating solution is preferably a PI solution including 2 to 5 wt % of silica or a PAI solution including 2 to 5 wt % of silica. Particularly useful is a PI solution or PAI solution including 2.5 wt % of silica.

Specifically, the PI solution comprises 15 to 35 wt % of PI and 2 to 5 wt % of silica, with a balance being the solvent, and the PAI solution comprises 15 to 35 wt % of PAI and 2 to 5 wt % of silica, with a balance being the solvent.

The anti-curling agent is responsible for preventing the curling of the end of the substrate 10 after curing of the protective coating layer 30.

In the case where the protective coating layer 30 resulting from applying the coating solution on the substrate 10 is dried and cured, the end of the substrate 10 may be curled while the protective coating layer 30 shrinks. Hence, the anti-curling agent is contained in the coating solution so as to prevent the curling of the end of the substrate 10 due to the shrinkage of the protective coating layer 30 when cured.

When 2 to 5 wt % of silica is added to the PI solution or PAI solution, the curling may be minimized, as evaluated experimentally.

The step of forming the protective coating layer 30 (S600) includes drying the coating solution applied on the first surface of the substrate 10 through heating at 90 to 150° C. for 5 to 25 minutes.

The protective coating layer 30 is preferably formed to a thickness of at least 9 μm, and preferably 10 μm or more, on the circuit pattern 20. This thickness corresponds to the minimum thickness that allows the protective coating layer to function as an insulating layer for insulating the circuit pattern 20.

In the step of forming the protective coating layer 30 (S600), the coating solution is applied on the first surface of the substrate 10 through screen printing, and the thickness of the coating solution may be adjusted by varying the mesh size of the screen upon screen printing.

The protective coating layer 30 is preferably formed through a single screen printing process in order to simplify the manufacturing process and to reduce the manufacturing cost, and screen printing may be performed using a mesh screen having a mesh size of 40 to 100 mesh per square inch, which means that the number of openings per square inch is 40 to 100. When the PI solution or PAI solution is applied on the substrate 10 using a mesh screen having a mesh size of 40 to 100 mesh per square inch, the protective coating layer 30 having a thickness of at least 9 μm on the circuit pattern 20 may be formed.

The step of forming the protective coating layer 30 (S600) preferably includes applying the coating solution on the substrate 10 through screen printing using a waterproof mesh screen.

The waterproof mesh screen may improve the passing of the coating solution, and thus the coating solution having high viscosity, that is, the PI solution or PAI solution may be applied on the substrate 10. Accordingly, the protective coating layer 30 may be formed to be thicker through a single coating process, and the protective coating layer 30 having a thickness of at least 9 μm on the circuit pattern 20 may be easily formed through a single coating process.

The protective coating layer 30 functions to protect the circuit pattern 20 formed on the first surface of the substrate 10, to more securely attach the circuit pattern 20 to the substrate 10, and to prevent the separation of the circuit pattern 20 from the substrate 10 despite the warpage of the substrate 10.

The method for manufacturing the flexible printed circuit board according to an embodiment of this disclosure further comprises polishing the fired circuit pattern 20 (S500) before the step of forming the protective coating layer 30 (S600).

When the circuit pattern 20 printed with the conductive paste is fired, a portion of the surface thereof may become hydrophobic, making it difficult to efficiently apply the coating solution.

The polishing step (S500) is performed by partially polishing the surface of the circuit pattern 20 to remove the hydrophobic portion from the circuit pattern 20, so that the coating solution may be efficiently applied on the circuit pattern 20 in the step of forming the protective coating layer 30 (S600).

In the polishing step (S500), the surface of the circuit pattern 20 is polished by 1 to 3 μm in a manner in which a polishing roll such as a brush roll is brought into contact with the surface of the circuit pattern 20 while rotating.

Figure 10:
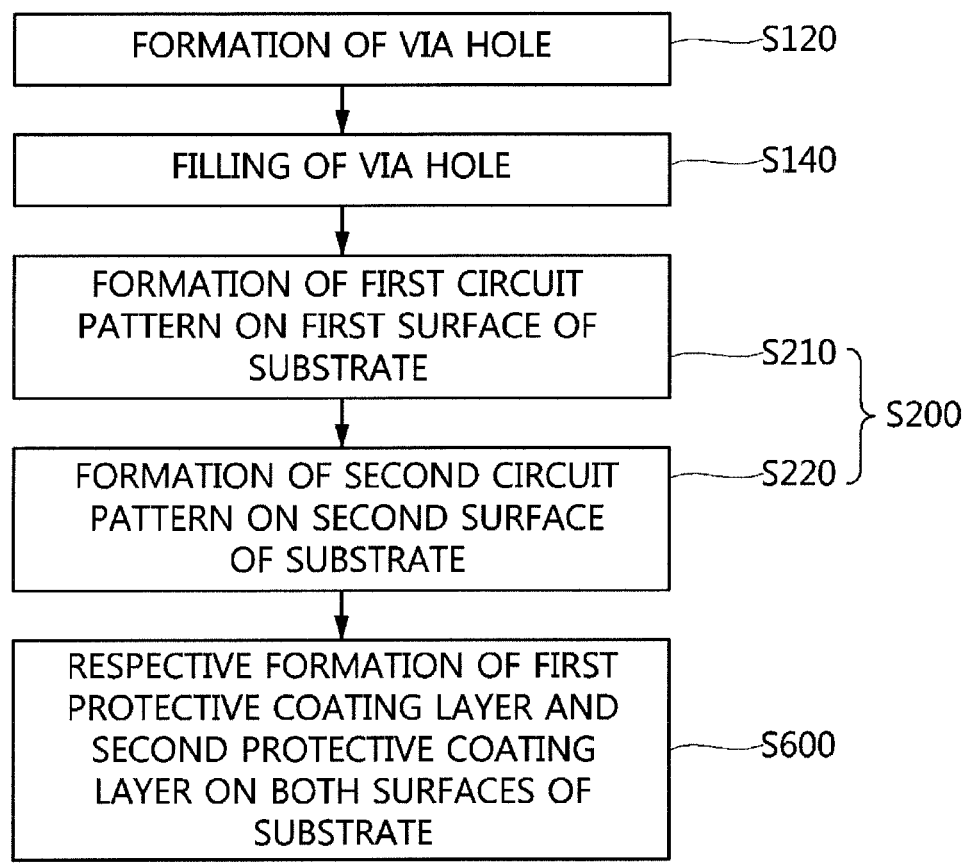
FIG. 10 is a flowchart illustrating the process of manufacturing a flexible printed circuit board according to still another embodiment of this disclosure.
Figure 11:
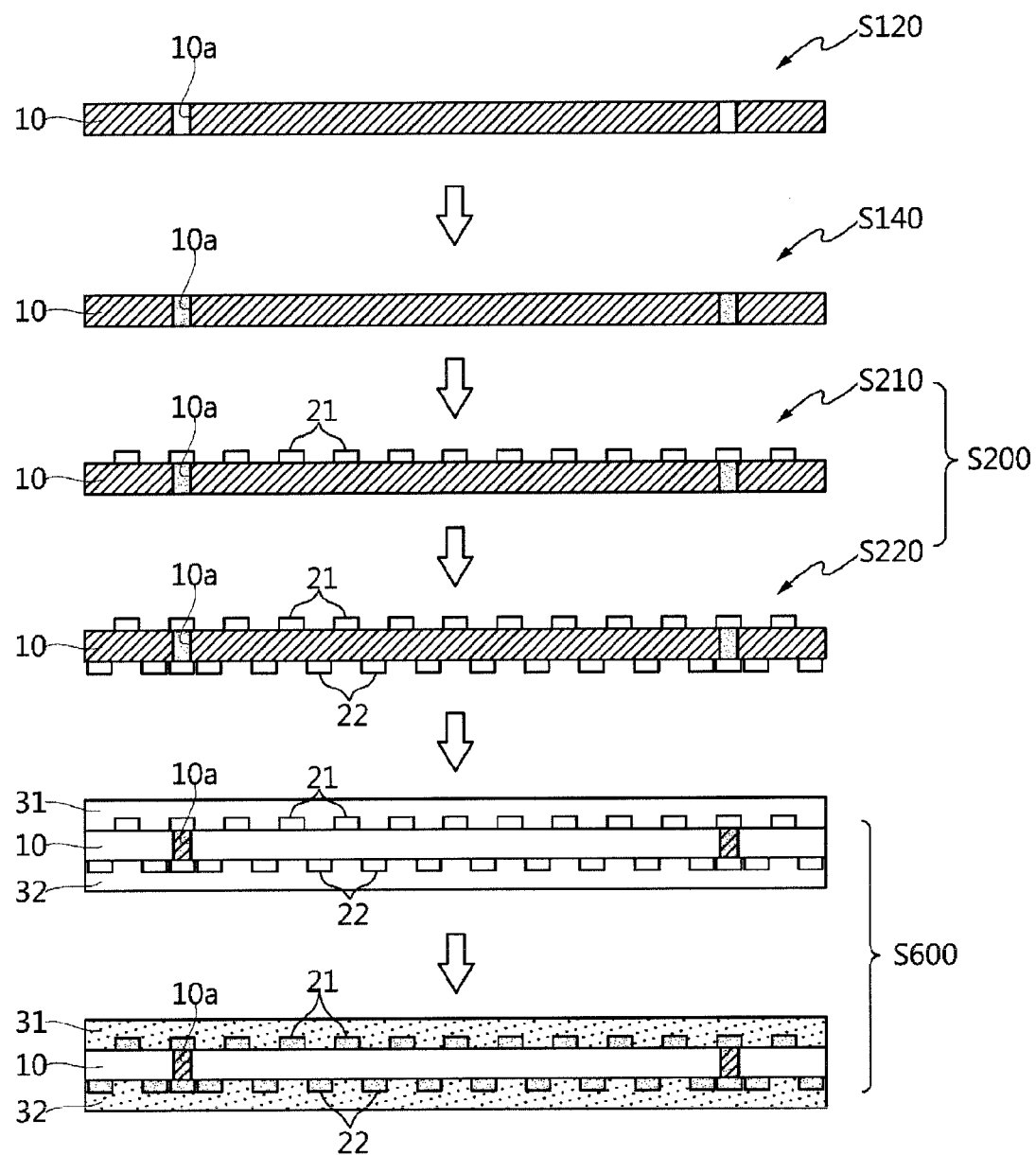
FIG. 11 schematically illustrates the process of manufacturing a flexible printed circuit board according to still another embodiment of this disclosure.

With reference to FIGS. 10 and 11, the method for manufacturing the flexible printed circuit board according to an embodiment of this disclosure preferably further comprises forming a via hole 10a in the substrate (S120) and filling the via hole 10a with a conductor (S140) before the step of forming the circuit pattern 20 (S200). Also, the step of forming the circuit pattern 20 (S200) may include forming a first circuit pattern 21 on the first surface of the substrate 10 (S210) and forming a second circuit pattern 22 on the second surface of the substrate 10 (S220).

The via hole 10a may be formed using a drill or laser at a position necessary for the substrate 10, that is, a position suitable for a predesigned circuit. The via hole 10a is provided to electrically connect the first circuit pattern 21, formed on the first surface of the substrate 10, to the second circuit pattern 22, formed on the second surface of the substrate 10. The step of filling the via hole (S140) may include loading the conductive paste in the via hole 10a, so that the first circuit pattern 21 may be electrically connected to the second circuit pattern 22 formed on the second surface of the substrate 10.

The step of filling the via hole (S140) may be performed through plating with a conductive metal, such as silver, copper, aluminum or gold, or through printing with a conductive paste. Alternatively, the filling step may be carried out in a manner in which a conductor for electrically connecting the first circuit pattern 21 and the second circuit pattern 22 to each other is loaded in the via hole 10a.

The steps of forming the first circuit pattern 21 (S210) and forming the second circuit pattern 22 (S220) may include attaching metal foil such as copper foil, silver foil or aluminum foil to the substrate 10 and then etching the metal foil, or may include punching metal foil such as copper foil, silver foil or aluminum foil and then transferring the metal foil.

Alternatively, the steps of foliating the first circuit pattern 21 (S210) and forming the second circuit pattern 22 (S220) may be performed by printing the conductive paste on the substrate 10 and then firing it.

The step of forming the protective coating layer (S600) includes applying, drying and curing the coating solution on the first surface and the second surface of the substrate 10, thus forming a first protective coating layer 31 and a second protective coating layer 32 for covering and protecting the first circuit pattern 21 and the second circuit pattern 22, respectively, on the first surface and the second surface of the substrate 10.

Figure 12:
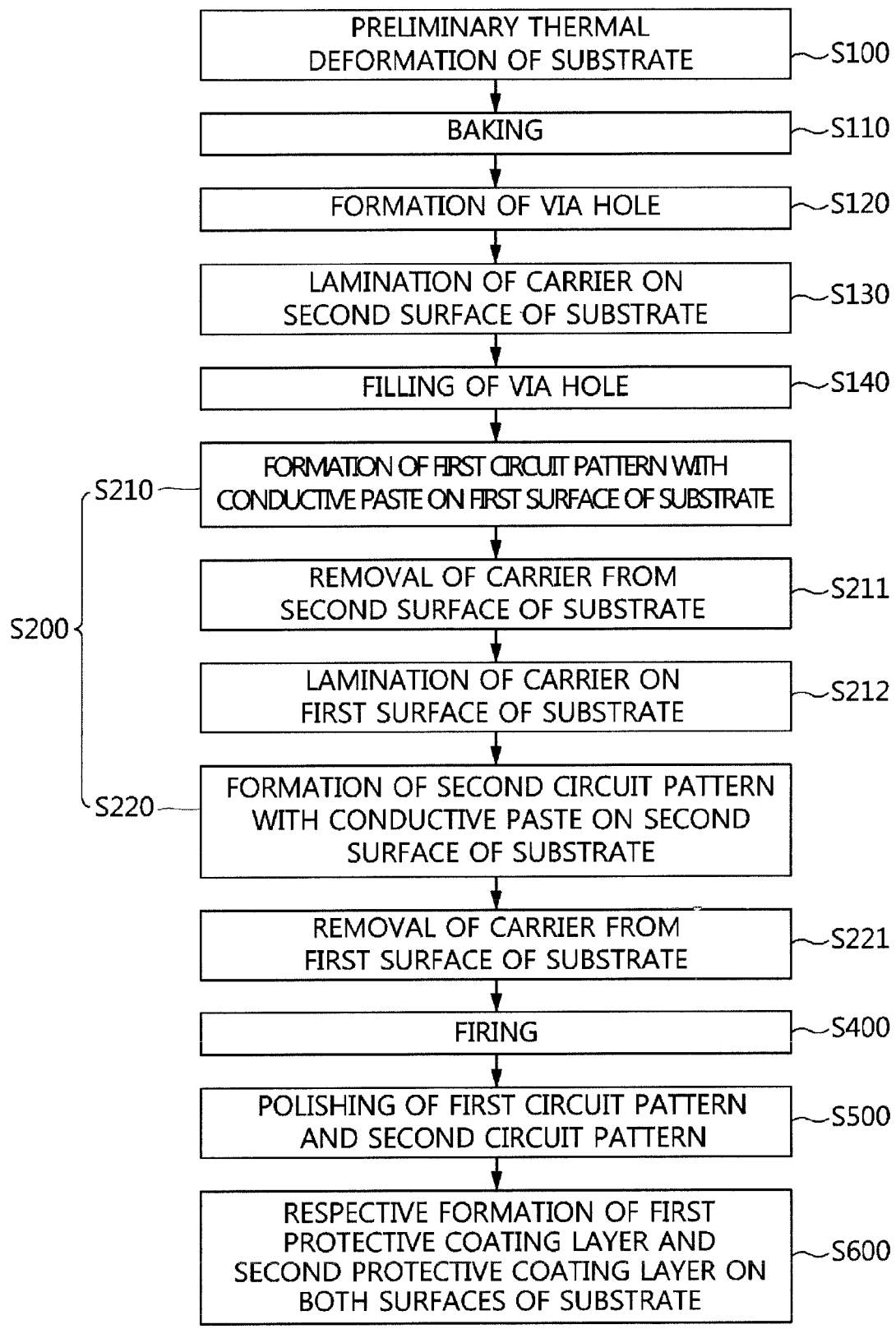
FIG. 12 is a flowchart illustrating the process of manufacturing a flexible printed circuit board according to yet another embodiment of this disclosure.
Figure 13:
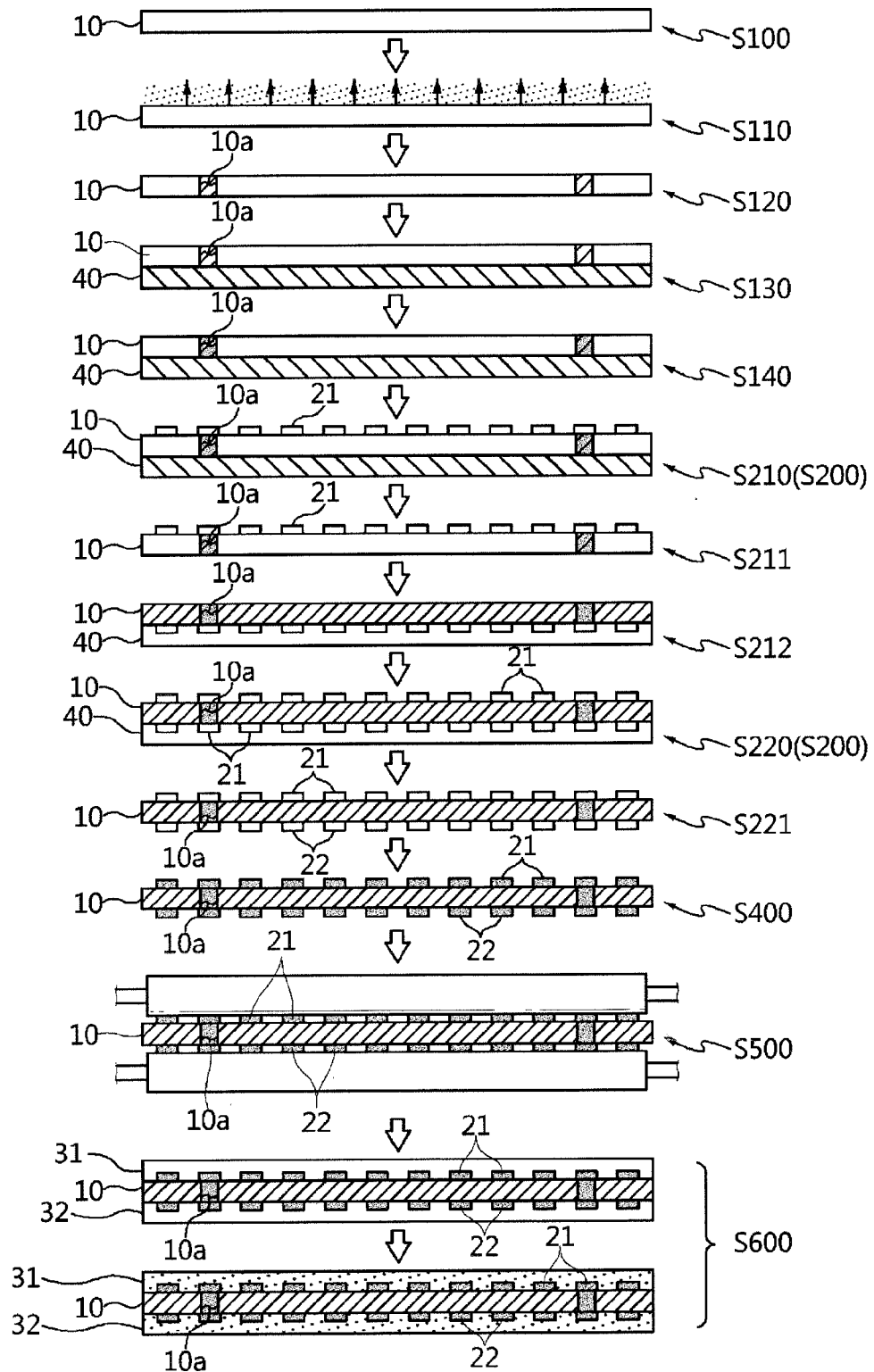
FIG. 13 schematically illustrates the process of manufacturing a flexible printed circuit board according to yet another embodiment of this disclosure.

With reference to FIGS. 12 and 13, the method for manufacturing a flexible printed circuit board according to another embodiment of this disclosure is described below.

The steps of forming the first circuit pattern 21 (S210) and forming the second circuit pattern 22 (S220) preferably include printing the conductive paste, and the firing step (S400) includes firing the first circuit pattern 21 and the second circuit pattern 22.

The steps of forming the first circuit pattern 21 (S210) and forming the second circuit pattern 22 (S220) may include drying the printed conductive paste, before the firing step (S400), and the conductive paste may be dried at a temperature of 80° C. or less.

The steps of forming the first circuit pattern 21 (S210) and forming the second circuit pattern 22 (S220) may include subjecting the conductive paste to screen printing. The screen printing exhibits a high rate and superior adhesion and flexibility, and is thus suitable for forming a fine pattern, so that a predesigned circuit pattern may be formed at low cost.

For example, the first circuit pattern 21 may be an X-axis coordinate recognition pattern part having a plurality of X-axis electrodes spaced apart from each other in a transverse direction, and the second circuit pattern 22 may be a Y-axis coordinate recognition pattern part having a plurality of Y-axis electrodes spaced apart from each other in a longitudinal direction.

The flexible printed circuit board according to this disclosure is exemplified by a digitizer configured such that the X-axis coordinate recognition pattern part is formed on the first surface of the substrate 10 and the Y-axis coordinate recognition pattern part is formed on the second surface of the substrate 10 to determine the coordinates of touch points. The X-axis coordinate recognition pattern part and the Y-axis coordinate recognition pattern part are electrically conducted to each other through the via hole 10a.

The first circuit pattern 21 and the second circuit pattern 22 may be provided in a grid form, composed of a plurality of sets of X-Y coordinates on the first and second surfaces of the substrate 10.

The first circuit pattern 21 and the second circuit pattern 22 may result from screen printing with conductive paste and then firing, thereby remarkably lowering the cost of manufacturing of the digitizer for use in an electronic blackboard having a large screen.

In the firing step (S400), the first circuit pattern 21 and the second circuit pattern 22 formed of the silver paste on the substrate 10 are fired at 200 to 450° C.

In the firing step (S400), the conductive paste loaded in the via hole 10a is fired.

In the polishing step (S500), the surfaces of the first circuit pattern 21 and the second circuit pattern 22 are partially polished, whereby the hydrophobic portions are removed from the first circuit pattern 21 and the second circuit pattern 22, and the coating solution is efficiently applied on the first circuit pattern 21 and the second circuit pattern 22 in the step of forming the protective coating layer (S600).

In the polishing step (S500), the surfaces of the first circuit pattern 21 and the second circuit pattern 22 may be polished by 1 to 3 μm by bringing a polishing roll such as a brush roll, which is rotating, into contact with the surface of the first circuit pattern 21 and the second circuit pattern 22.

The method for manufacturing the flexible printed circuit board according to an embodiment of this disclosure preferably further comprises laminating a carrier 40 on the second surface of the substrate 10 (S130), between the steps of forming the via hole 10a (S120) and filling the via hole 10a (S140).

Specifically, the via hole 10a is formed in the substrate 10, the carrier 40 is laminated on the second surface of the substrate 10, and the via hole 10a is printed with the conductive paste on the first surface of the substrate 10, thereby filling the via hole 10a with the conductive paste.

The carrier 40 functions to sufficiently fill the via hole 10a with the conductive paste. Also, the carrier 40 may prevent the conductive paste from flowing to the second surface of the substrate 10 through the via hole 10a and may absorb the conductive paste, whereby the conductive paste may be loaded only in the via hole 10a. Accordingly, contamination of the substrate 10 and thus short circuits, attributable to the flow of the conductive paste to the second surface of the substrate 10, may be prevented.

Also, the carrier 40 may prevent the conductive paste from flowing to the second surface of the substrate 10 and may absorb the conductive paste when the conductive paste is printed in the course of forming the first circuit pattern 21 (S210), whereby the conductive paste may be loaded only in the via hole 10a. Thereby, contamination of the substrate 10 and thus short circuits, attributable to the flow of the conductive paste to the second surface of the substrate 10, may be prevented.

The carrier 40 includes an absorbent paper, preferably a writing paper. Writing paper has low density, so that the conductive paste is absorbed well between the pores therein. The carrier 40 has an adhesive attached thereto, and is thus easily laminated on the substrate 10.

The carrier 40 may be laminated on or removed from the first or second surface of the substrate 10 using a roll-to-roll process. The roll-to-roll process is continuously performed in a manner in which, while the substrate 10, in the form of a roll, is unwound, the carrier 40 is laminated on the surface of the substrate 10, and the conductive paste is printed on the surface of the substrate opposite the surface on which the carrier 40 is laminated, thereby forming a pattern. The roll-to-roll process enables mass production and reduces the production cost.

The step of filling the via hole (S140) is performed so that the conductive paste is completely loaded in the via hole by preliminarily filling the via hole 10a with the conductive paste on the first surface of the substrate 10 before forming the first circuit pattern 21 (S210).

In the step of filling the via hole 10a (S140), the via hole 10a may be sufficiently filled with the conductive paste on the first surface of the substrate 10, but may be insufficiently filled with the conductive paste on the second surface of the substrate 10.

The portion of the via hole 10a that is not filled with the conductive paste on the second surface of the substrate 10 is filled in the course of forming the second circuit pattern 22 (S220), whereby the conductive paste is loaded into the via hole to thus stably electrically connect the first circuit pattern 21 and the second circuit pattern 22 to each other, ultimately increasing operational reliability.

Also, the method for manufacturing the flexible printed circuit board according to this disclosure further comprises removing the carrier 40 from the second surface of the substrate 10 (S211) after forming the first circuit pattern on the first surface of the substrate 10, laminating the carrier 40 on the first surface of the substrate 10 (S212) before forming the second circuit pattern, and removing the carrier 40 from the first surface of the substrate 10 (S221) after forming the second circuit pattern 22 (S220).

The carrier 40 functions to block the via hole 10*a* in the first surface of the substrate 10 so that the via hole 10*a* is filled with sufficient conductive paste. Also, the conductive paste loaded in the via hole 10*a* may be prevented from flowing toward the first surface of the substrate 10 in the course of forming the second circuit pattern 22 (S220).

The carrier 40 enables the conductive paste to be sufficiently loaded in the via hole 10*a*. Also, the carrier 40 may block the conductive paste from flowing to the first surface of the substrate 10 through the via hole 10*a* and may absorb the conductive paste, whereby the conductive paste is loaded only in the via hole 10*a*. Ultimately, contamination of the substrate 10 and thus short circuits, attributable to the flow of the conductive paste toward the first surface of the substrate 10, are prevented.

The firing step (S400) may include firing the first circuit pattern 21 before forming the second circuit pattern 22 (S220), and firing the second circuit pattern 22 after forming the second circuit pattern 22 (S220).

The first circuit pattern 21 is printed with the conductive paste on the first surface of the substrate 10, followed by primary drying and primary sintering, after which the second circuit pattern 22 is printed with the conductive paste on the second surface of the substrate 10, followed by secondary drying and secondary sintering. Thereby, the via hole 10*a* may be filled with sufficient conductive paste, and operational reliability between the first circuit pattern 21 and the second circuit pattern 22, which are electrically connected through the via hole 10*a*, may result.

Firing the first circuit pattern 21 is performed to fix the shape of the conductive paste on the dried insulating film having no carrier 40. When the dried conductive paste is sintered, the shape of the conductive paste loaded in the via hole 10*a* is maintained, and further shrinkage does not occur.

The via hole 10*a* is filled with sufficient conductive paste, and interfacial separation from the substrate 10 and cracking may be prevented.

After firing the first circuit pattern 21, the top and bottom of the conductive paste loaded in the via hole 10*a* are recessed further, and become more concave, than after primary drying. However, the sintered conductive paste does not shrink any further, thus easily ensuring sufficient loading of the conductive paste into the via hole 10*a*.

The via hole 10*a* is primarily filled with the conductive paste so that the conductive paste is loaded in the via hole 10*a* when the first circuit pattern 21 is printed on the first surface of the substrate 10, and the via hole 10*a* is secondarily filled with the conductive paste so that the conductive paste is loaded in the via hole 10*a* when the second circuit pattern 22 is printed on the second surface of the substrate 10.

Thereby, the via hole 10*a* is filled with sufficient conductive paste, the first circuit pattern 21 and the second circuit pattern 22 of the substrate 10 are stably electrically connected to each other through the via hole 10*a*, and the operational reliability of the first circuit pattern 21 and the second circuit pattern 22 is ensured.

Figure 14:
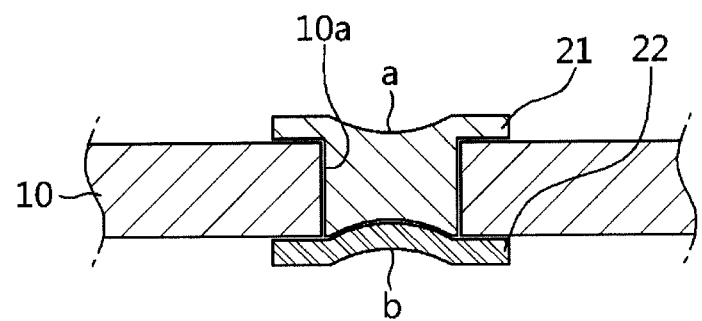
FIG. 14 is a cross-sectional view illustrating the via hole in the process of manufacturing the flexible printed circuit board according to this disclosure.

With reference to FIG. 14, the conductive paste loaded in the via hole 10*a* may be dried at a temperature of 80° C. or less. In the course of drying the conductive paste loaded in the via hole 10*a*, the top a and bottom b thereof may become recessed due to gravity.

The case where the via hole 10*a* is filled once is problematic in that the via hole is incompletely filled, thus causing an operational reliability problem when the first circuit pattern 21 is connected to the second circuit pattern 22. When the conductive paste is dried, the shape thereof in the via hole 10*a* may become concave due to gravity. Hence, the via hole 10*a* has to be filled twice in order to ensure the reliability of the via hole 10*a*.

Specifically, the via hole 10*a* is primarily filled with the conductive paste before printing the first circuit pattern 21 on the first surface of the substrate 10, and the via hole 10*a* is secondarily filled with the conductive paste before printing the second circuit pattern 22 on the second surface of the substrate 10.

Thereby, sufficient conductive paste is loaded in the via hole 10*a*, thus assuring reliability of the connection between the pattern on the first surface of the insulating film and the pattern on the second surface thereof through the via hole 10*a*.

Figure 15:
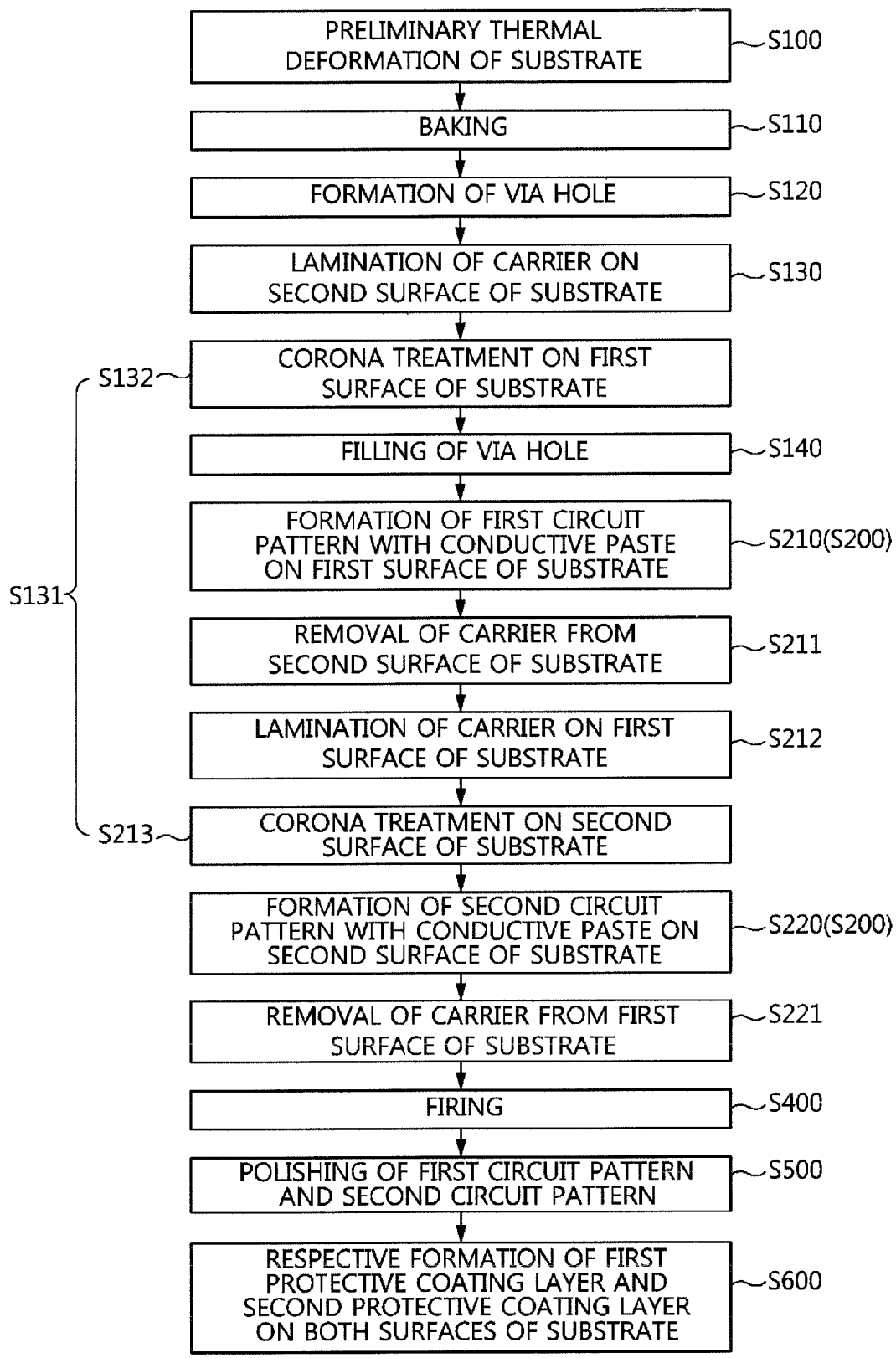
FIG. 15 is a flowchart illustrating the process of manufacturing a flexible printed circuit board according to still yet another embodiment of this disclosure.

With reference to FIG. 15, the method according to this disclosure further comprises performing corona treatment (S131) for modifying the surface of the substrate 10, before forming the first circuit pattern 21 (S210).

The corona treatment step (S131) includes subjecting the first surface of the substrate 10 to corona treatment (S132) before forming the first circuit pattern 21 (S210) and subjecting the second surface of the substrate 10 to corona treatment (S213) before forming the second circuit pattern 22 (S220).

The corona treatment step (S131) is performed to modify the entire surface of the substrate 10 or a pattern-forming portion thereof.

Surface modification may be carried out using any one selected from among plasma treatment, corona treatment, laser processing, etching, and physical treatment. Particularly useful is corona treatment, which is characterized by a short treatment time and high workability.

Corona treatment functions to modify the surface of the substrate 10 without damage such as shrinkage or deformation to the substrate 10, thus enhancing adhesion between the substrate 10 and the conductive paste.

Surface modification of the entire surface of the substrate 10 or a pattern-forming portion thereof may enhance adhesion between the conductive paste and the substrate 10, thereby solving the problem of stripping of the sintered conductive paste.

Subjecting the first surface of the substrate 10 to corona treatment (S132) is preferably performed after the carrier 40 is laminated on the substrate 10 and the via hole is filled (S140). The via hole 10*a* is filled with the conductive paste, after which the conductive paste loaded in the via hole 10*a* may be dried. When drying is performed after corona treatment, the effect of corona treatment is reduced. Hence, when filling the via hole 10*a* with the conductive paste, performing the corona treatment, and printing the pattern with the conductive paste on the substrate 10 are continuously carried out, the corona treatment effect is most preferably improved.

Subjecting the second surface of the substrate 10 to corona treatment (S213) is performed as follows: the step of filling the via hole (S140) is not additionally carried out because the via hole 10*a* is filled when the second circuit pattern 22 is printed, the carrier 40 is laminated on the second surface of the substrate 10, corona treatment is performed, and then the second circuit pattern 22 is formed through printing with the conductive paste.

In this disclosure, corona treatment is particularly useful, or alternatively, plasma treatment may be carried out on the entire surface of the substrate 10 or a pattern-forming portion thereof, thus forming fine roughness, thereby enhancing the adhesion between the conductive paste and the substrate 10.

Figure 16:
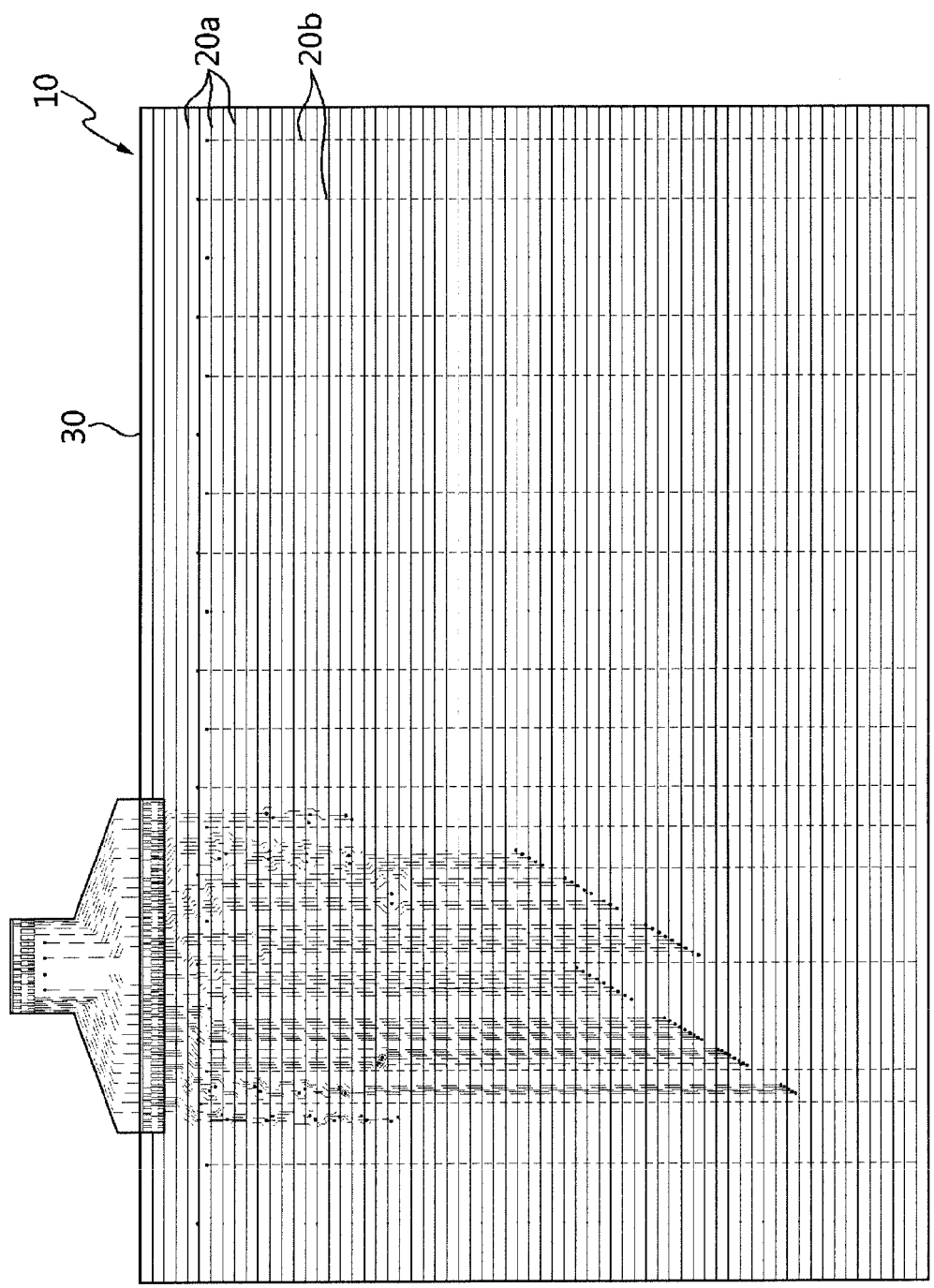
FIG. 16 illustrates a digitizer, which is an example of the flexible printed circuit board according to this disclosure.

FIG. 16 illustrates a digitizer, according to an embodiment of this disclosure, in which the circuit pattern 20 is an X-axis coordinate recognition pattern part including a plurality of X-axis electrodes spaced apart from each other in a transverse direction and the additional circuit pattern 20a is a Y-axis coordinate recognition pattern part including a plurality of Y-axis electrodes spaced apart from each other in a longitudinal direction.

According to this disclosure the digitizer as illustrated in FIG. 16 may be manufactured simply and inexpensively, and this disclosure is suitable for manufacturing the digitizer, which is applied to an electronic blackboard having a large screen because the effect of the digitizer is increased with an increase in size thereof.

According to this disclosure, the circuit pattern 20 formed on the substrate 10 is protected by the coating layer, thus maintaining the circuit pattern 20 firmly attached to the substrate 10. Furthermore, damage and deformation of the circuit pattern 20, due to repeated bending or warping of the substrate 10, may be prevented, thus improving operational reliability.

According to this disclosure, there is no need for an additional coverlay, and high chemical resistance may be attained because the circuit pattern is protected by the coating layer.

According to this disclosure, the multilayered flexible printed circuit board is made thin, whereby products using the same may be compactly manufactured and merchantability may increase.

According to this disclosure, the manufacturing cost may be lowered, resulting in considerably increased merchantability.

Although the preferred embodiments of this disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A method for manufacturing a flexible printed circuit board, comprising:
    forming a circuit pattern on a substrate;
    polishing the circuit pattern; and
    forming a protective coating layer for covering and protecting the circuit pattern by applying a coating solution on the substrate;
    wherein forming the circuit pattern comprises:
        printing a conductive paste; and
        firing the conductive paste,
    wherein polishing the circuit pattern includes polishing a surface of the circuit pattern after firing to remove a hydrophobic portion,
    wherein forming the protective coating layer includes directly applying the coating solution on the polished surface of the circuit pattern.

2. The method of claim 1, wherein the conductive paste is a silver paste comprising a silver powder, a polymer resin, and a solvent, and the silver paste comprises 73 to 88 wt % of a silver powder, 5.9 to 9.5 wt % of a polymer resin, and 5.7 to 18.0 wt % of a solvent, and the firing is performed at 200 to 450° C.

3. The method of claim 1, wherein forming the protective coating layer comprises applying the coating solution, excluding a portion in which a via hole is formed.

4. The method of claim 1, wherein the coating solution is a PAI solution or a PI solution.

5. The method of claim 1, wherein the coating solution further comprises an anti-curling agent.

6. The method of claim 1, wherein the coating solution is a PI solution including 2 to 5 wt % of silica or a PAI solution including 2 to 5 wt % of silica.

7. The method of claim 1, wherein forming the protective coating layer comprises applying the coating solution on the substrate through screen printing using a waterproof mesh screen.

8. The method of claim 1, further comprising forming a via hole in the substrate and filling the via hole with a conductor before forming the circuit pattern,
    forming the circuit pattern comprising forming a first circuit pattern on a first surface of the substrate and forming a second circuit pattern on a second surface of the substrate, and
    forming the protective coating layer comprising applying, drying and curing a coating solution on the first surface of the substrate and the second surface of the substrate, thus forming a first protective coating layer for covering and protecting the first circuit pattern and a second protective coating layer for covering and protecting the second circuit pattern on the first surface of the substrate and the second surface of the substrate, respectively.

9. The method of claim 1, further comprising baking the substrate through heating to remove water therefrom before forming the circuit pattern.

* * * * *

UNITED STATES PATENT AND TRADEMARK OFFICE
CERTIFICATE OF CORRECTION

PATENT NO. : 9,949,379 B2  
APPLICATION NO. : 14/897214  
DATED : April 17, 2018  
INVENTOR(S) : Jongsoo Kim et al.

Page 1 of 1

It is certified that error appears in the above-identified patent and that said Letters Patent is hereby corrected as shown below:

In the Specification

| | | |
|---|---|---|
| Column 7, | Line 33, | change "circuit hoard according" to --circuit board according-- |
| Column 14, | Line 59, | change "of foliating the" to --of forming the-- |

Signed and Sealed this  
Third Day of July, 2018

Andrei Iancu  
*Director of the United States Patent and Trademark Office*